(12) United States Patent
Greenwald

(10) Patent No.: US 6,601,933 B1
(45) Date of Patent: Aug. 5, 2003

(54) TELESCOPING SLIDE WITH QUICK-MOUNT SYSTEM

(75) Inventor: William B. Greenwald, Beech Grove, IN (US)

(73) Assignee: General Devices Co., Inc., Indianapolis, IN (US)

( * ) Notice: Subject to any disclaimer, the term of this patent is extended or adjusted under 35 U.S.C. 154(b) by 0 days.

(21) Appl. No.: 10/177,552

(22) Filed: Jun. 21, 2002

(51) Int. Cl.[7] .............................................. A47B 88/00
(52) U.S. Cl. ................ 312/333; 312/330.1; 312/334.46
(58) Field of Search ........................... 312/333, 334.44, 312/334.45, 334.46, 334.47, 334.7, 330.1, 334.8, 319.1; 384/21, 22

(56) References Cited

U.S. PATENT DOCUMENTS

| | | | |
|---|---|---|---|
| 516,583 A | 3/1894 | Adkins | |
| 1,698,252 A | 1/1929 | Ashe | |
| 2,749,200 A | 6/1956 | Kuss | |
| 2,809,086 A | 10/1957 | Fall | |
| 3,624,703 A | * 11/1971 | Pavek | ........................ 62/298 |
| 3,650,578 A | * 3/1972 | Del Vecchio et al. | ......... 384/18 |
| 3,679,274 A | * 7/1972 | Nance | ........................ 384/21 |
| 4,423,914 A | 1/1984 | Vander Ley | |
| 4,441,772 A | 4/1984 | Fielding et al. | |
| 5,199,777 A | 4/1993 | Taima et al. | |
| 5,292,198 A | 3/1994 | Rock et al. | |
| 5,405,195 A | 4/1995 | Hobbs | |
| 5,433,517 A | 7/1995 | Fleisch | |
| 5,580,138 A | 12/1996 | Grabher | |
| 5,620,244 A | 4/1997 | Yang | |
| 5,632,542 A | 5/1997 | Krivec | |
| 5,671,988 A | 9/1997 | O'Neill | |
| 5,683,159 A | 11/1997 | Johnson | |
| 5,730,514 A | 3/1998 | Hashemi | |
| 5,823,648 A | 10/1998 | Domenig | |
| 5,904,412 A | 5/1999 | Lammens | |
| 6,027,194 A | 2/2000 | Fleisch | |
| 6,209,979 B1 | * 4/2001 | Fall et al. | ................ 312/330.1 |

FOREIGN PATENT DOCUMENTS

DE            3347540         *    7/1985    ............ 312/334.46

* cited by examiner

*Primary Examiner*—Janet M. Wilkens
(74) *Attorney, Agent, or Firm*—Barnes & Thornburg

(57) ABSTRACT

A telescoping slide assembly includes interconnected load-carrying, intermediate, and stationary slides. A post-locking latch is mounted to move relative to the load-carrying slide to control movement of a mounting post on a piece of equipment to be carried on the load-carrying slide into and out of a post-receiving slot formed in the load-carrying slide.

30 Claims, 12 Drawing Sheets

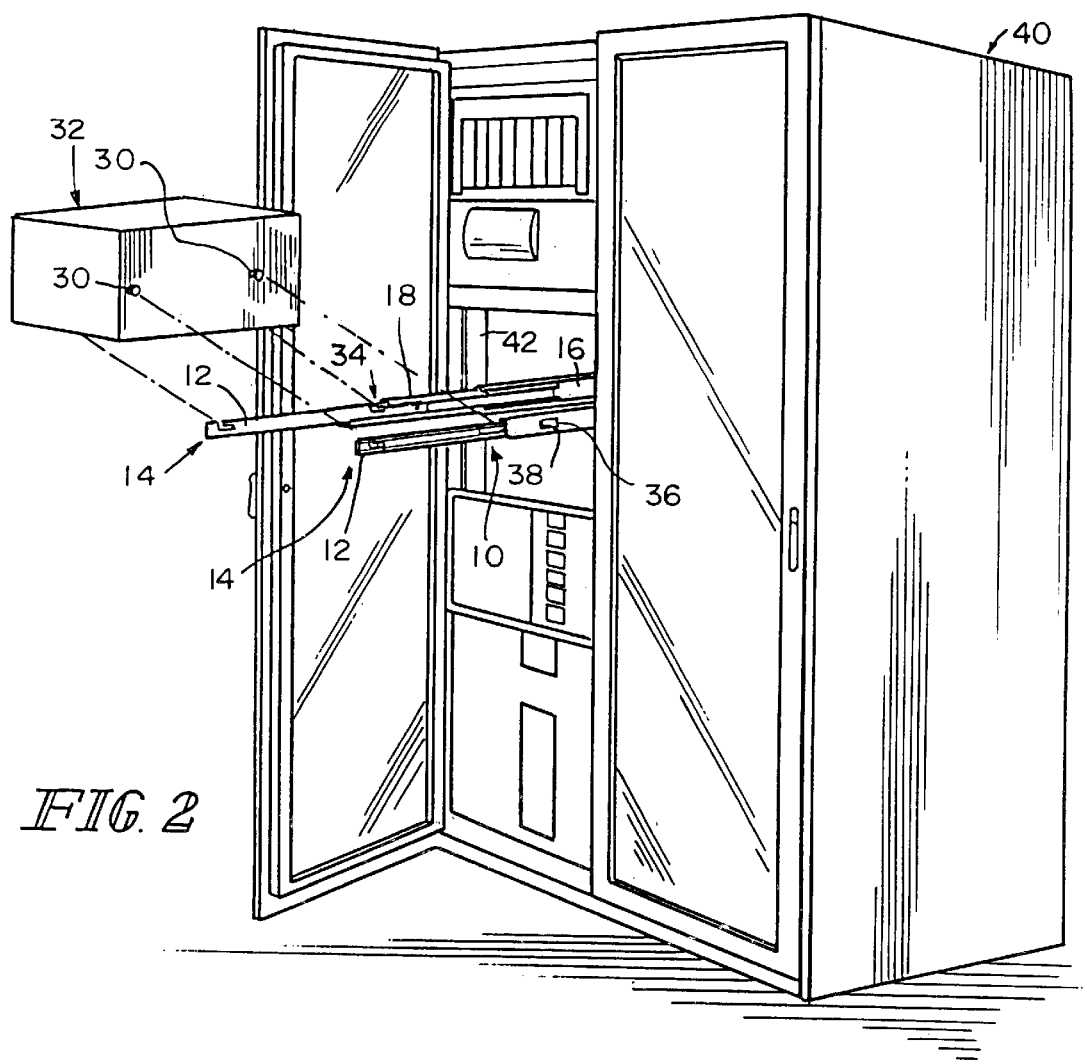
FIG. 2
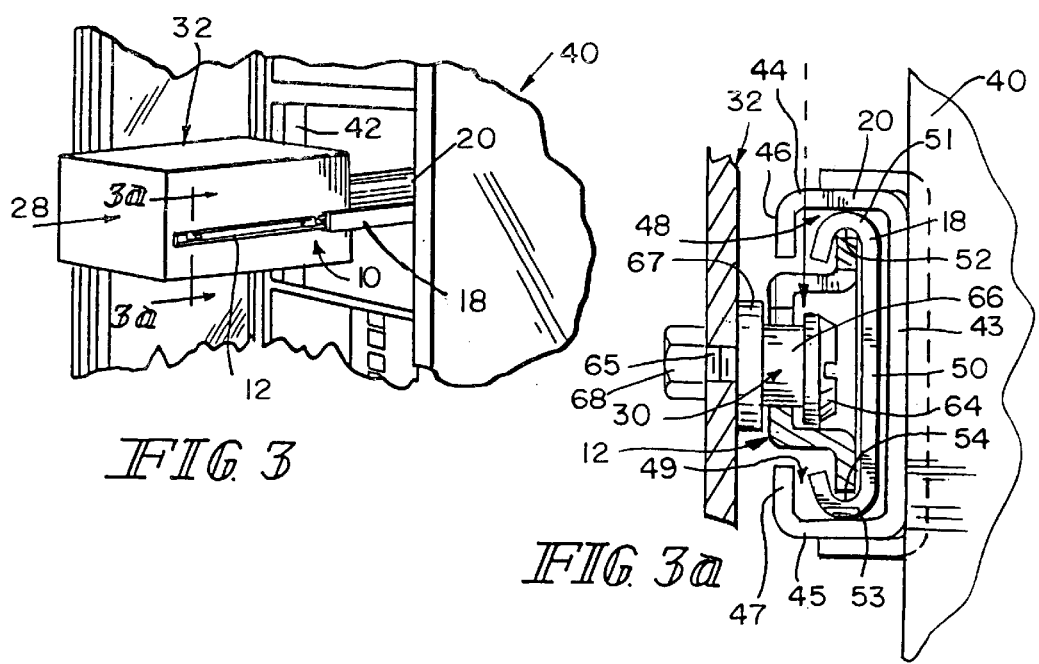
FIG. 3
FIG. 3a

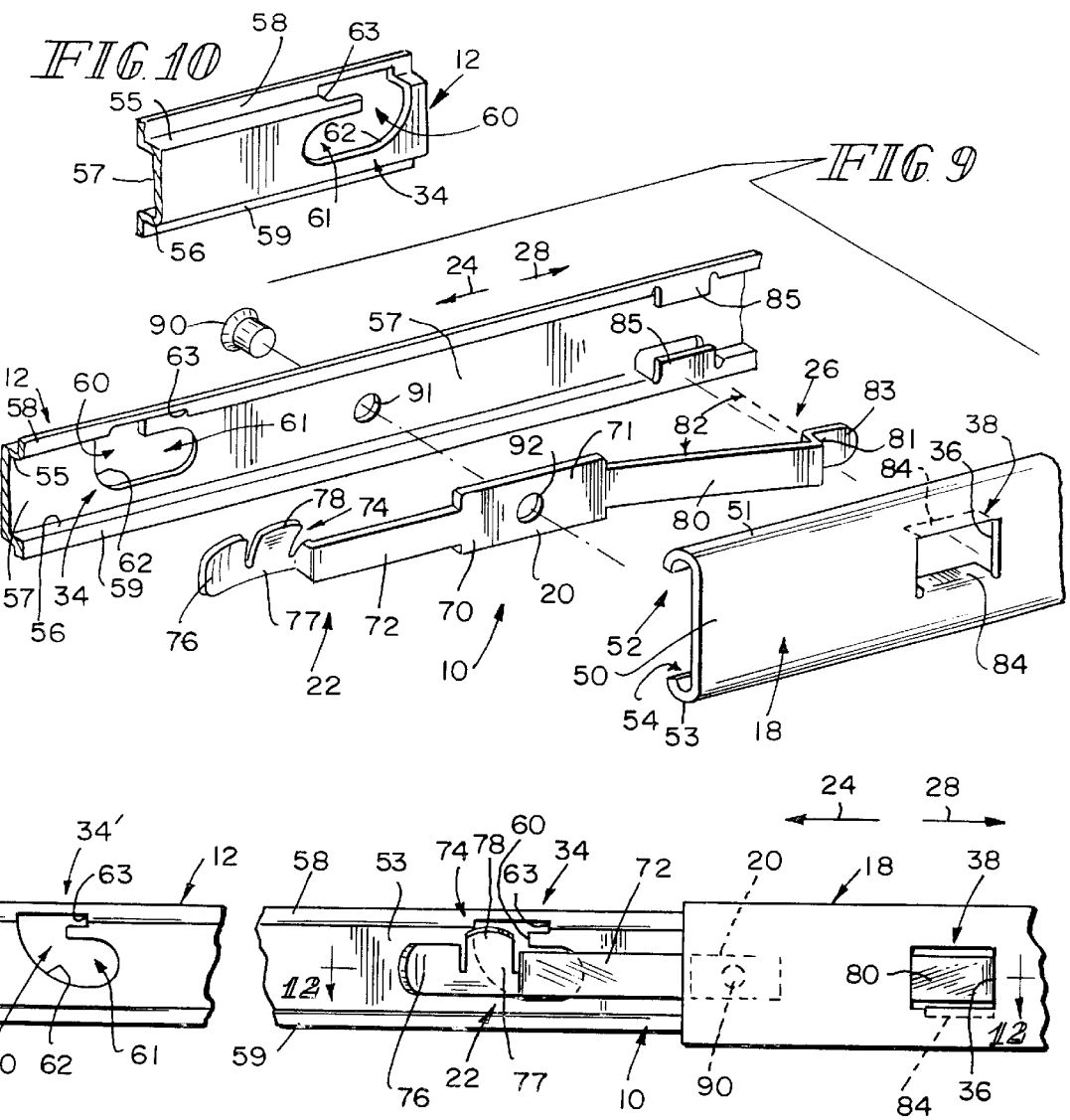

TELESCOPING SLIDE WITH QUICK-MOUNT SYSTEM

BACKGROUND AND SUMMARY

The present disclosure relates to telescoping slide assemblies, and particularly to a slide assembly having at least two telescoping slide members. More particularly, the present invention relates to a pair of spaced-apart telescoping slide assemblies which are adapted to be releasably coupled to a piece of equipment, known as a chassis, which is positioned to lie therebetween.

According to the present disclosure, a telescoping slide assembly comprises interconnected load-carrying, intermediate, and stationary slides movable relative to one another to extend and retract the load-carrying and intermediate slides relative to the stationary slide between fully extended and retracted positions. The load-carrying slide is formed to include a slot adapted to receive a mounting post coupled to a piece of equipment to be carried on the load-carrying slide. The intermediate slide is formed to include a retraction stop.

The telescoping slide assembly further comprises a retainer coupled to the load-carrying slide to move therewith. The retainer includes a post-locking latch arranged to move from a slot-closing position blocking exit of a mounting post in the slot from the slot and a slot-opening position allowing movement of a mounting post into and out of the slot. The retainer further includes a slide lock arranged to move from a retraction-blocking position engaging the retraction stop on the intermediate slide to block movement of the load-carrying slide relative to the intermediate slide from the fully extended position toward the retracted position to a release position disengaging the retraction stop on the intermediate slide to allow movement of the load-carrying slide relative to the intermediate slide toward the retracted position.

In an illustrative embodiment, the retainer includes a base coupled to the load-carrying slide. The post-locking latch is provided by a first strip of material cantilevered to one portion of the base. The slide lock is provided by a second strip of material cantilevered to another portion of the base to cause the base to lie between the post-locking latch and the slide lock. In a presently preferred embodiment, a single piece of spring metal is formed to define the post-locking latch, the base, and the slide lock.

Features of the present disclosure will become apparent to those skilled in the art upon consideration of the following detailed description of illustrative embodiments exemplifying the best mode of carrying out the disclosure as presently perceived.

BRIEF DESCRIPTION OF THE DRAWINGS

The detailed description particularly refers to the accompanying figures in which:

FIG. 2 is perspective view of the chassis (e.g., a server) shown in FIG. 1 before the chassis is mount to two fully extended telescoping slide assemblies fixed in a cabinet.

FIG. 3 is a perspective view similar to FIG. 2 showing the chassis mounted on the slide assemblies just before the chassis is pushed inwardly (in the direction of the arrow) in to a stored position within the cabinet;

FIG. 3a is a section view taken along line 3a—3a of FIG. 3 showing the position of one of the mounting posts coupled to the chassis and received within one of the post-receiving slots formed in the load-carrying slide of the three-part telescoping slide assembly;

FIG. 4 is a perspective view of a chassis mounted on the chassis-support load-carrying slides included in two telescoping slide assemblies showing engagement of a movable retractor blocker (included in the rear-end portion of the retainer coupled to each chassis-support slide) against a retraction stop (provided along one edge of a rectangular aperture formed in each intermediate slide) to block movement of the load-carrying slide toward a stored position in the cabinet;

FIG. 5 is a view similar to FIG. 4 showing movement of each load-carrying slide into its companion intermediate slide following manual movement (by a user) of the movable retractor blockers in the rear-end portions of the retainers to disengage the retraction stops prodivided in the intermediate slides;

FIG. 6 is a view similar to FIGS. 4 and 5 showing movement of each set of load-carrying and intermediate slides (together as a unit) into the companion stationary slide fixed to a rack mounted inside the cabinet;

FIG. 9 is a perspective assembly view showing the retainer of FIG. 1 before the base of the retainer is coupled to a vertical wall of the load-carrying slide to position the retainer in a space between the load-carrying and intermediate slides and showing that the front-end portion of the retainer (on the left side of the base) includes a post-locking latch for engaging a chassis-mounting post inserted into the L-shaped post-receiving slot and also showing that the rear-end portion of the retainer (on the right side of the base) includes a load-carrying slide lock carrying the movable retractor blocker;

FIG. 10 is a perspective view of a portion of the load-carrying slide of FIG. 9 (taken from the opposite side—see FIG. 8) showing a back wall that includes the L-shaped post-receiving slot;

FIG. 11 is a side elevation view of the components shown in FIG. 9 after assembly showing that the post-locking latch included in the front-end portion of the retainer lies next to one of the L-shaped post-receiving slots and that the movable retractor blocker included in the rear-end portion of the retainer extends into the rectangular aperture formed in the intermediate slide;

FIG. 15 is an enlarged elevation view taken along line 15—15 of FIG. 7 showing a user manually lowering the chassis to position mounting posts coupled to the chassis above openings into the two L-shaped post-receiving slots in the load carrying slide;

FIG. 18 is a view similar to FIG. 15 showing movement of one of the mounting posts against a cam member included in a post-locking latch portion of the retainer;

FIG. 21 is a view similar to FIGS. 15 and 18 showing movement of the two mounting posts to reach the bottom of a "vertical leg" of the L-shaped post-receiving slots;

FIG. 24 is a view similar to FIGS. 15, 18, and 21 showing return of the post-locking latch to a normal slot-closing position to block removal of the mounting post from the horizontal leg of the L-shaped post-receiving slot so that the chassis is locked in a fixed position on the load-carrying slide;

DETAILED DESCRIPTION OF THE DRAWINGS

Figure 1:
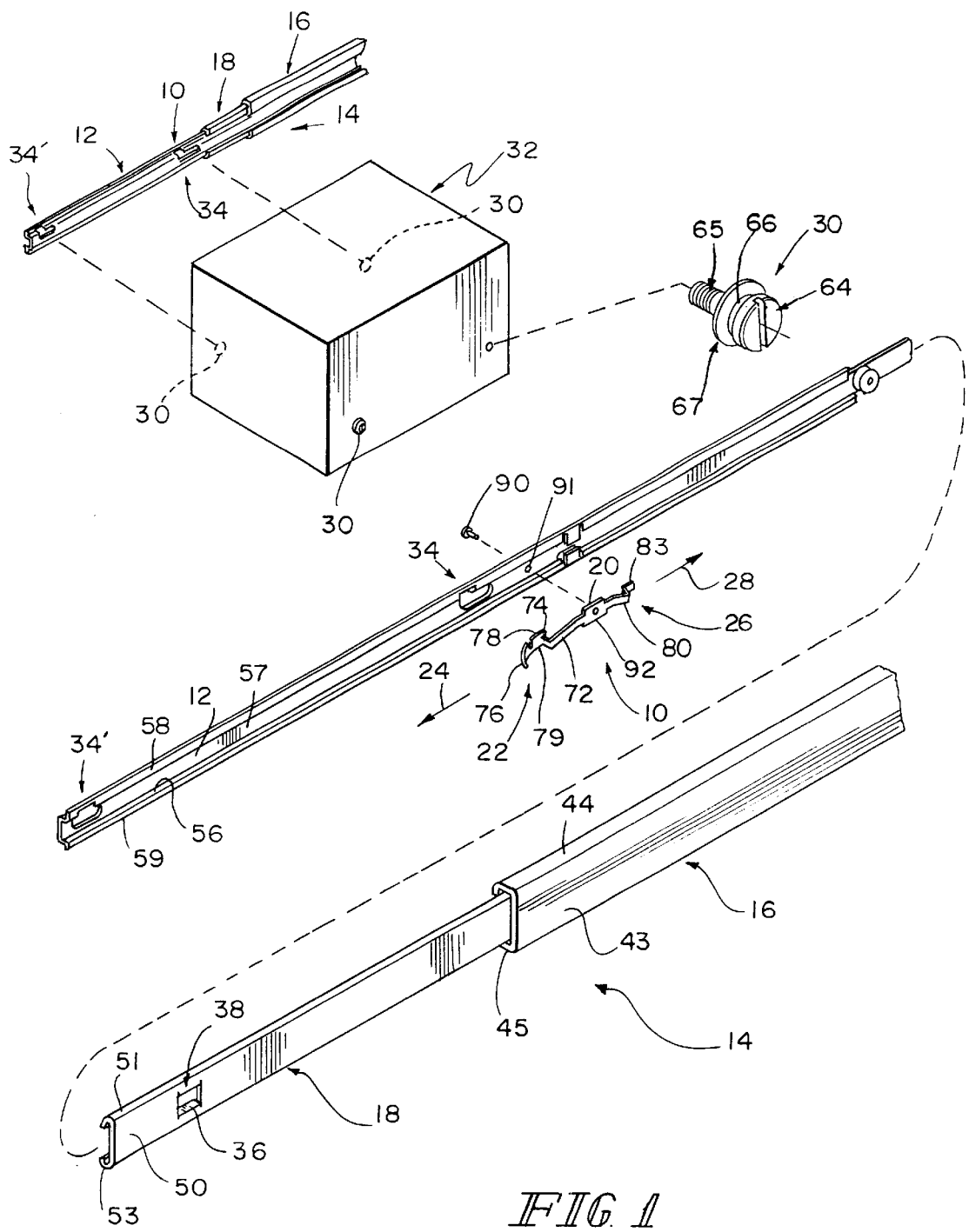
FIG. 1 is a perspective assembly view showing a piece of equipment, known as a "chassis," outfitted with four mounting posts and showing formation of two "L-shaped" post-receiving slots in the chassis-support load-carrying slides of two three-part telescoping slide assemblies and also showing a retainer adapted to be mounted on a load-carrying slide adjacent to one of the L-shaped post-receiving slots, the retainer having a "front-end" portion configured to operate automatically to lock one mounting post in position in each of the telescoping slide assemblies (as shown, for example, in FIGS. 13, 14, and 24–26), the retainer also having a "rear-end" portion configured to operate automatically to retain the load-carrying slide in an extended position relative to the intermediate slide (as shown, for example, in FIG. 4)
Figure 4:
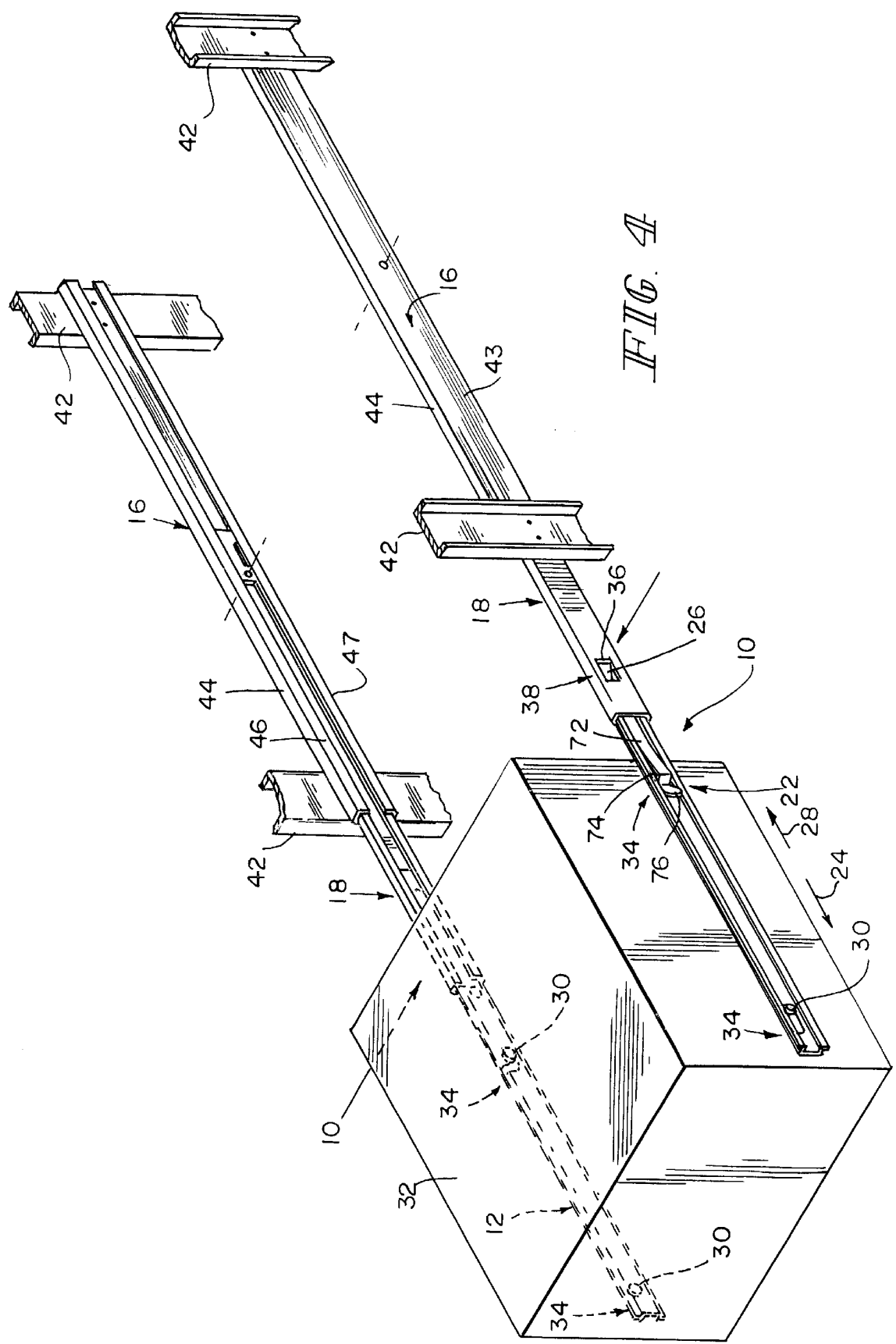
FIGS. 4–6 show movement of the chassis on the telescoping slide assemblies (from a fully extended position shown in FIG. 4) toward a stored position in the cabinet.
Figure 5:
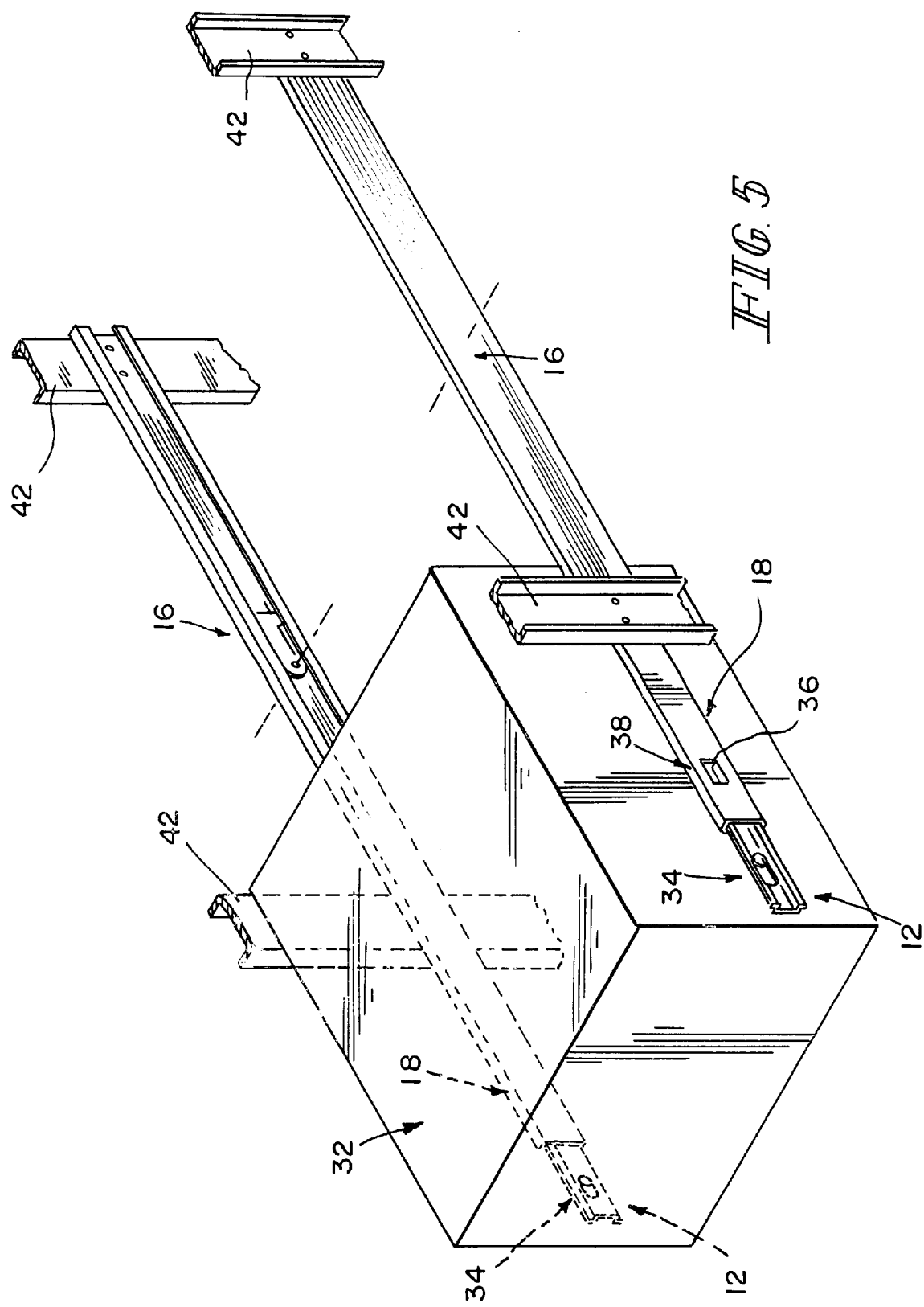
Figure 6:
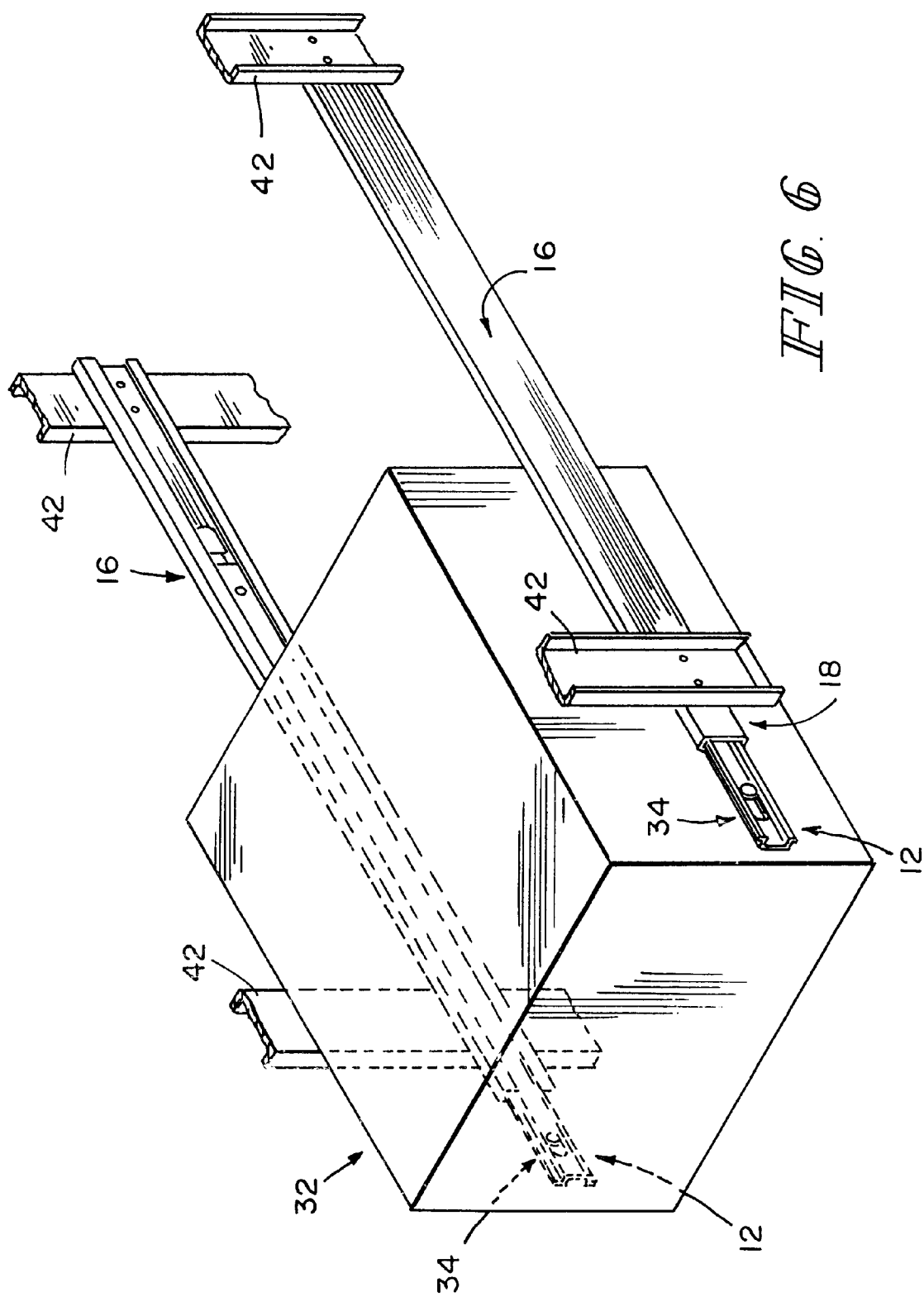
Figure 7:
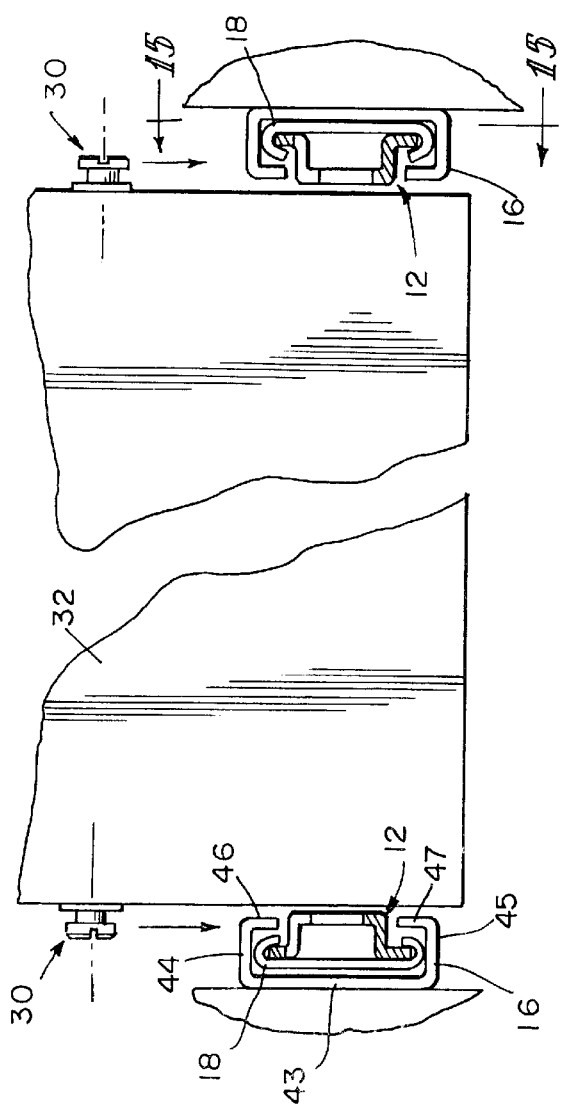
FIG. 7 is a partial front elevation view of the chassis shown in FIG. 2 as it is being lowered into place between the two specially adapted load-carrying slides of the telescoping slide assemblies.
Figure 12:
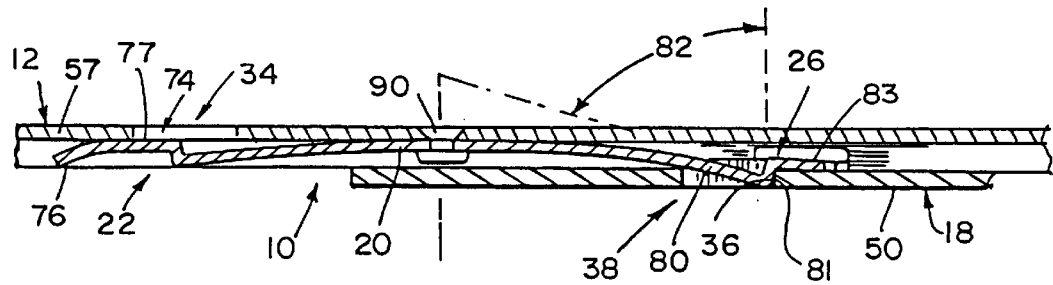
FIG. 12 is a sectional view taken along line 12—12 of FIG. 11.
Figure 13:
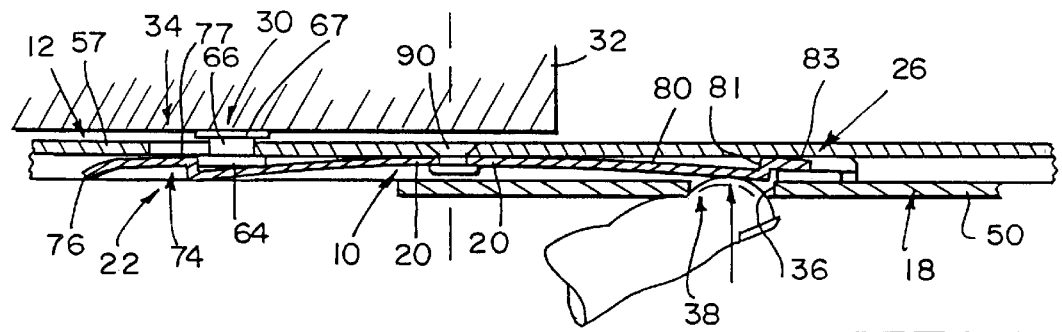
FIG. 13 is sectional view similar to FIG. 12 (after a chassis has been mounted on the load-carrying slide by trapping a mounting post in the L-shaped post-receiving slot using the post-locking latch provided on the front-end portion of the retainer) showing movement of the movable retraction blocker included in the slide lock to disengage the retraction stop provided by an interior rectangular aperture border edge included in the intermediate slide in response to a force applied to the slide lock by the finger of a user.
Figure 16:
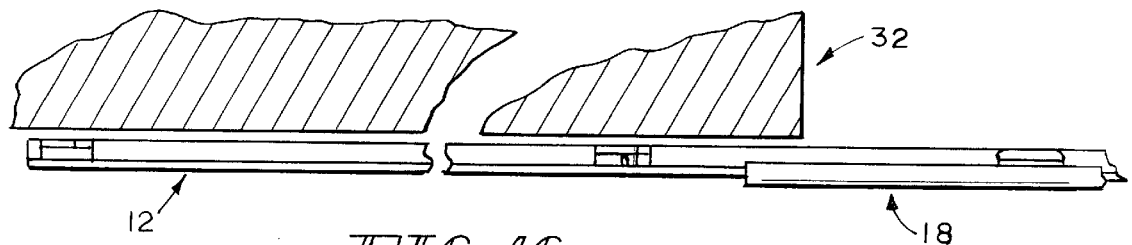
FIG. 16 is a partial top view of the chassis and slide assembly taken along line 16—16 shown in FIG. 15.
Figure 15:
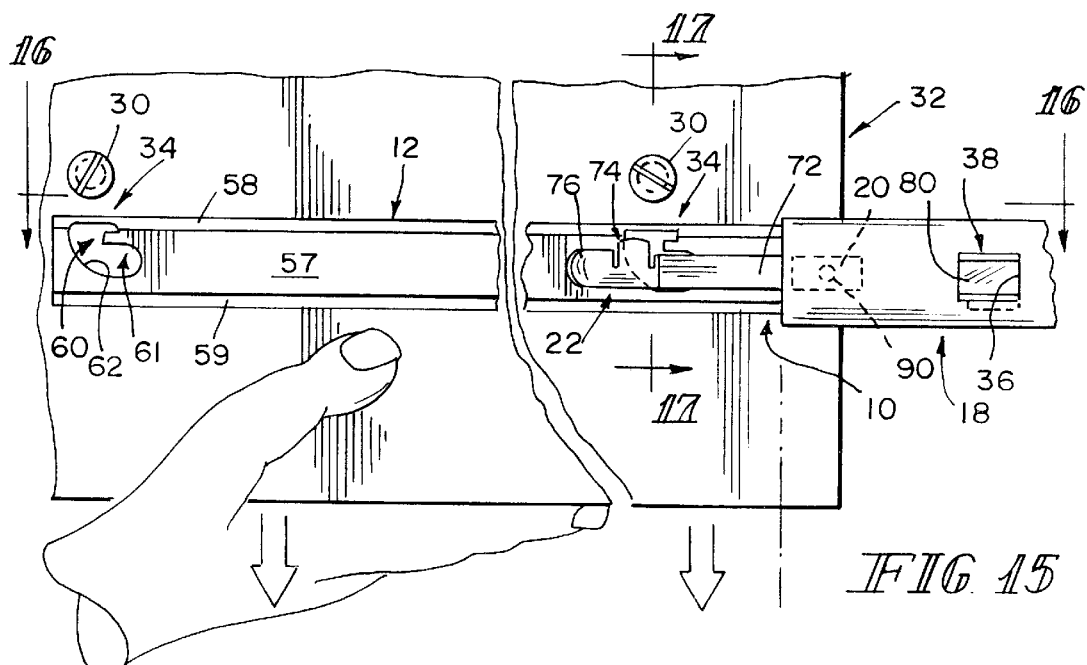
FIGS. 15, 18, 21, and 24 show a sequence in which certain mounting posts are lowered and locked into the L-shaped slots formed in one of the load-carrying slides.
Figure 17:
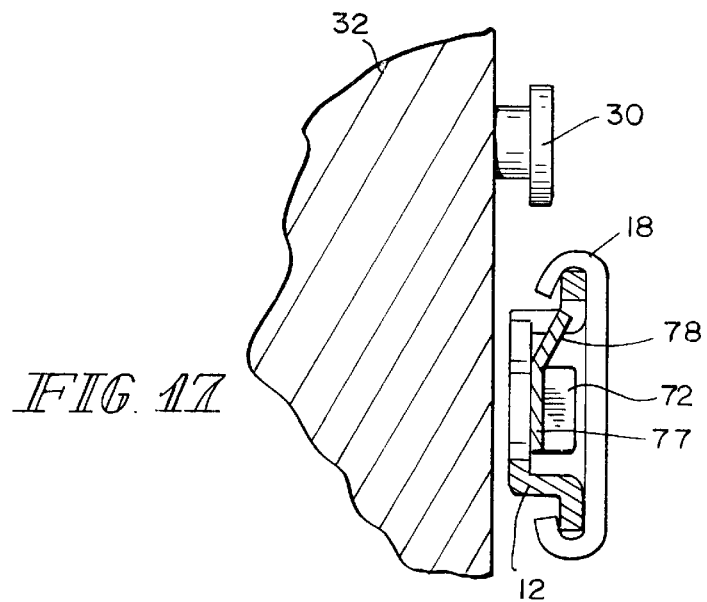
FIG. 17 is a sectional view taken along line 17—17 of FIG. 15.
Figure 19:
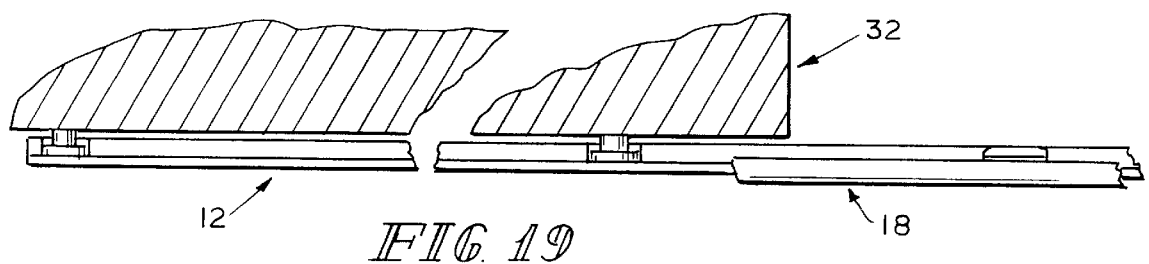
FIG. 19 is a partial top view of the chassis and slide assembly taken along line 19—19 shown in FIG. 18.
Figure 18:
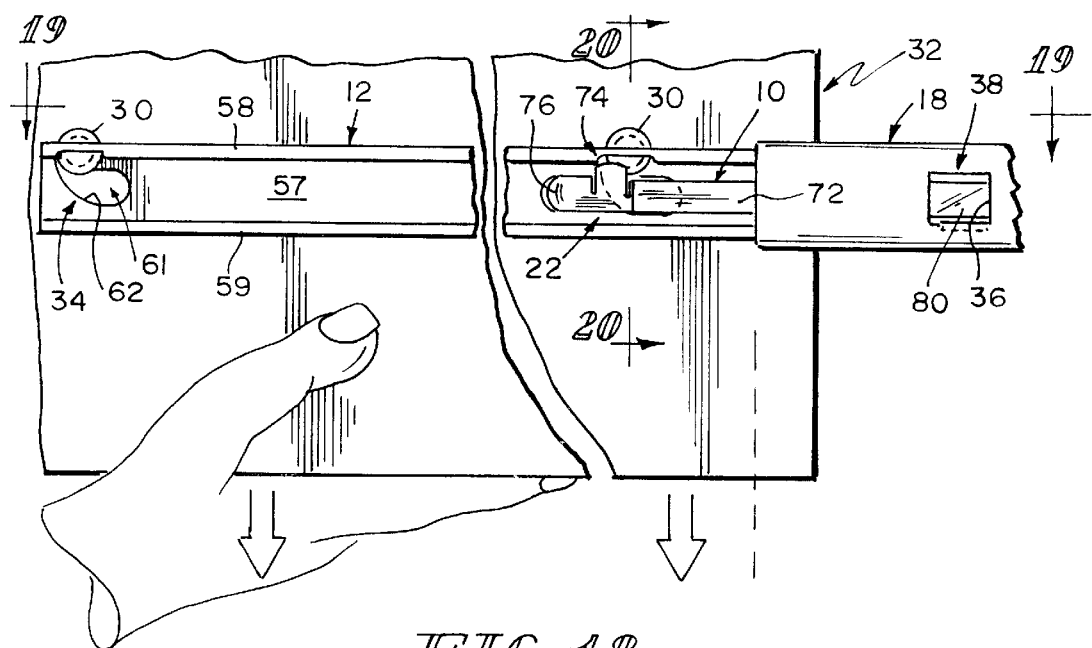
Figure 20:
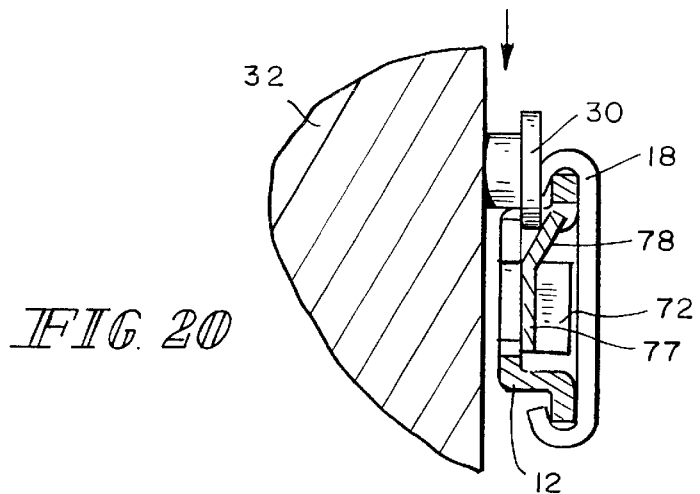
FIG. 20 is a sectional view taken along line 20—20 of FIG. 18.
Figure 22:
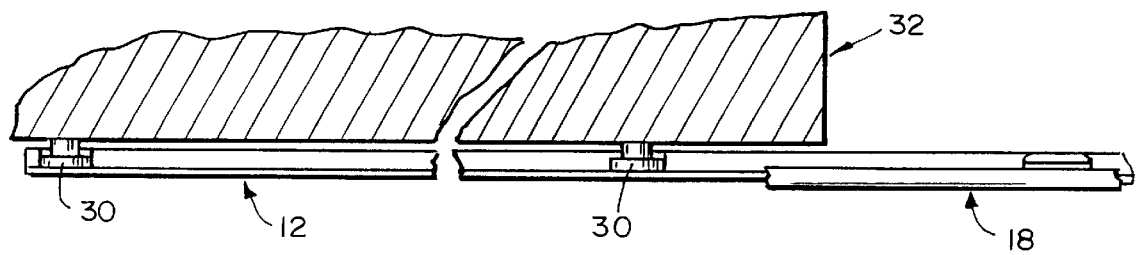
FIG. 22 is a partial top view of the chassis and slide assembly shown in FIG. 21.
Figure 21:
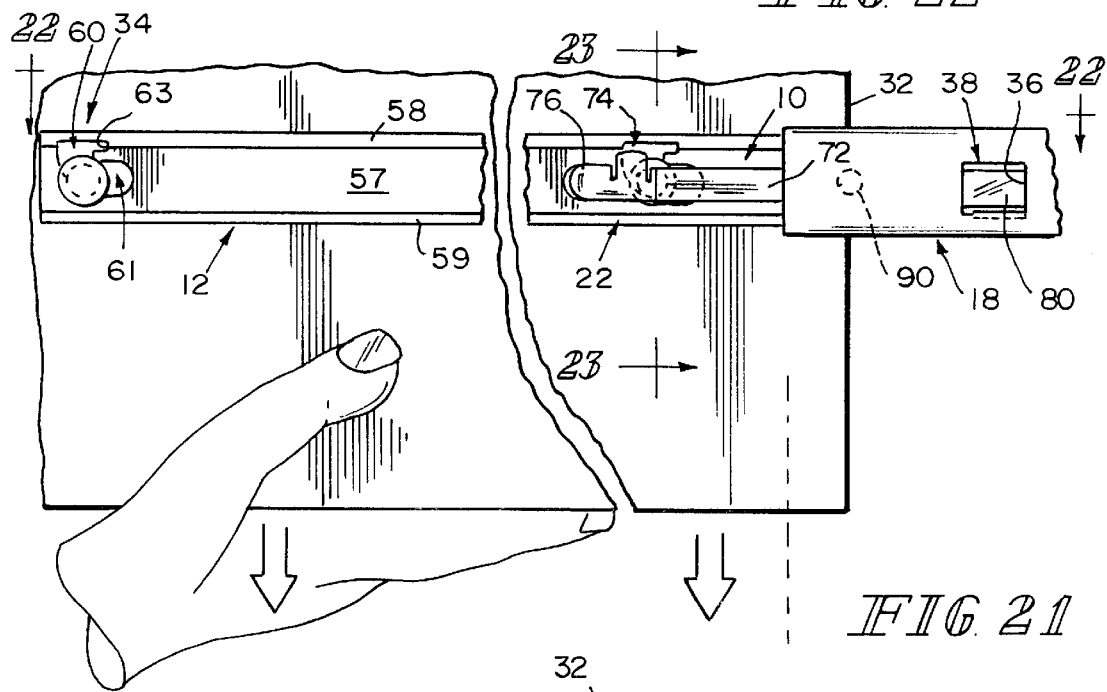
Figure 23:
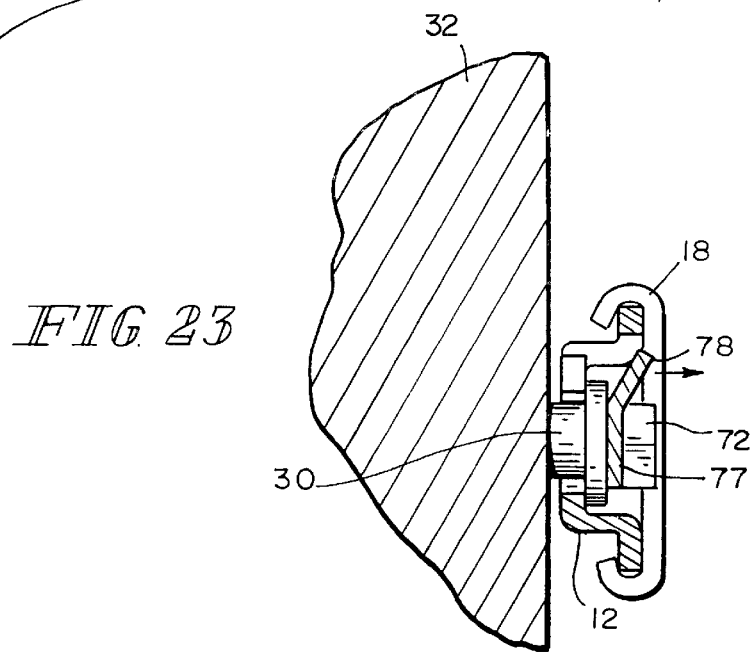
FIG. 23 is a sectional view taken along line 23—23 of FIG. 21.
Figure 25:
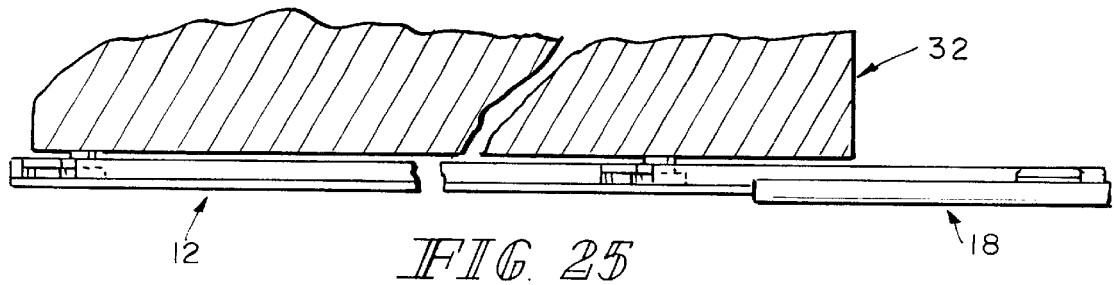
FIG. 25 is a partial top view of the chassis and slide assembly shown in FIG. 24.
Figure 24:
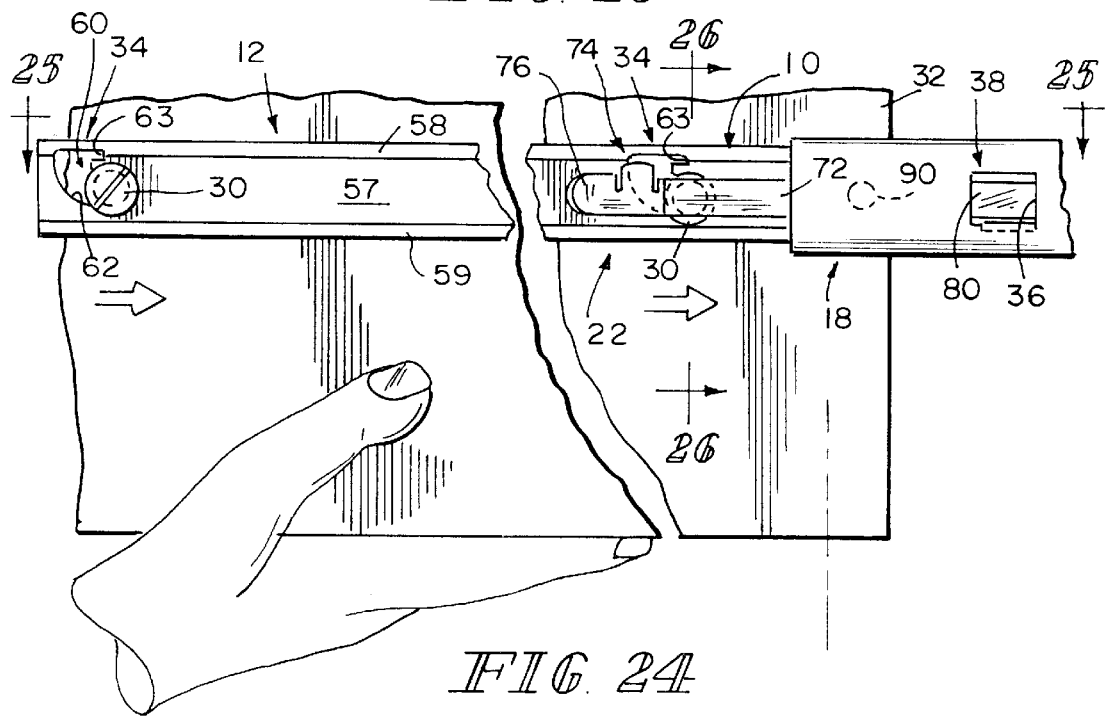
Figure 26:
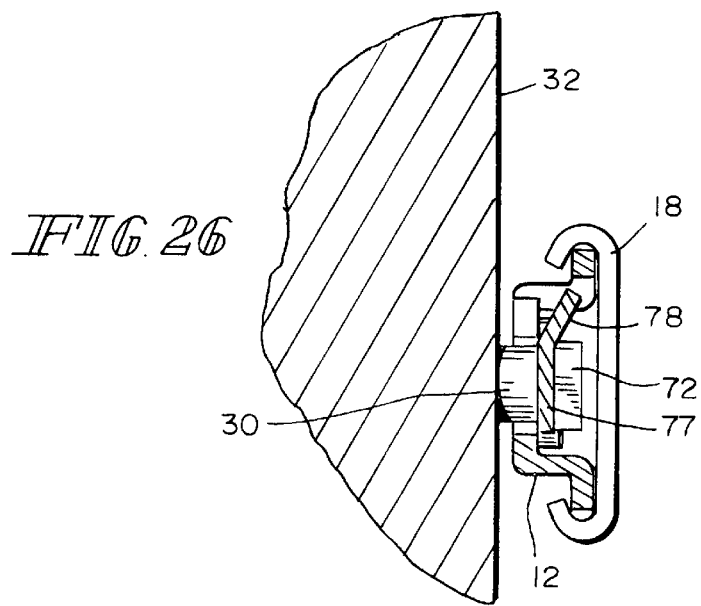
FIG. 26 is a sectional view taken along line 26—26 of FIG. 24.

A retainer 10 is coupled to a load-carrying slide 12 included in a telescoping slide assembly 14 comprising a stationary slide 16, an intermediate slide 18, and load-carrying slide 12 as suggested in FIGS. 1, 9, and 11. Retainer 10 includes a base 20 coupled to load-carrying slide 12, a post-locking latch 22 coupled to base 20 and arranged to extend in forward direction 24, and a slide lock 26 also coupled to base 20 and arranged to extend in a rearward direction 28. Post-locking latch 22 functions as shown, for example, in FIGS. 15, 18, 21, and 24 to regulate entry and exit of a mounting post 30 on a chassis 32 relative to a post-receiving slot 34 formed in load-carrying slide. Slide lock 26 functions as shown, for example, in FIGS. 12, 13, and 16 to engage a retraction stop 36 formed on intermediate slide 18 at, for example, intermediate slide aperture 38 to block movement of load-carrying slide 12 relative to intermediate slide 18 in rearward direction 28 from a fully extended position shown, for example, in FIGS. 2 and 4 in rearward direction 28 toward a retracted position shown, for example, in FIG. 6.

Mounting posts 30 are coupled to chassis 32 and adapted to be coupled to load-carrying slides 12 included in the pair of telescoping slide assemblies 14 mounted to lie in spaced-apart parallel relation to one another in a cabinet 40 as shown, for example, in FIGS. 1–3 to permit a user to mount and dismount chassis 32 quickly and easily. In one embodiment, chassis 32 is a server and cabinet 40 is a server cabinet.

Cabinet 40 includes, for example, a rack of computer equipment and chassis 32 is sized to be mounted on telescoping slide assemblies 14 to permit technicians to gain access to chassis 32 by moving it out of cabinet 40 on telescoping slide assemblies 14. Installation and replacement of such a chassis is quick and easy because of the way in which mounting posts 30 are released from "drop-and-lock" positions in post-receiving slides 12. Reference is made to U.S. Pat. No. 6,209,979, which is hereby incorporated in its entirety by reference herein, for a description of a chassis mounting post retention and release system.

Each telescoping slide assembly 14 is fixed to cabinet 40 and movable between a fully retracted position and a fully extended position relative to cabinet 40 so that chassis 32 may be stored within cabinet 40 as suggested by FIGS. 3–6. Stationary slide 16 is fixed to vertical rails 42 using any suitable brackets (not shown). As shown in FIGS. 1 and 3a, stationary slide 20 includes a vertical wall 43, a top wall 44, a bottom wall 45, and first and second rims 46, 47. An upper channel 48 is formed by top wall 44 and first rim 46 and a lower channel 49 is formed by bottom wall 45 and second rim 47.

Intermediate slide 18 includes a vertical wall 50, a top wall 51 formed to define upper channel 52, and a bottom wall 53 formed to define lower channel 54 as shown, for example, in FIG. 3a. Intermediate-slide 18 is received within stationary slide 16 as shown, for example, in FIGS. 1 and 3a for sliding movement therein.

Load-carrying slide 12 includes a pair of horizontally extending flanges 55, 56 and a vertically extending wall 57 located between the pair of horizontally extending flanges 55, 56. A vertically extending upper lip 58 is coupled to flange 55 and a vertically extending lower lip 59 is coupled to flange 56. Each post-receiving slot 34 formed in load-carrying slide 12 includes a vertically extending entry portion 60 and a horizontally extending post-retainer portion 61 as shown best in FIGS. 9–11. Entry portion 60 merges with post-retainer portion 61 at heel portion 62 and entry portion 60 communicates with inlet opening 63 formed in horizontally extending flange 55 of load-carrying slide 12.

Each mounting post 30 includes a head 64 at one end, an anchor 65 at an opposite end, a throat 66 positioned to lie between head 64 and anchor 65, and a flange 67 positioned to lie between anchor 65 and throat 66 as shown, for example, in FIGS. 1 and 3a. In the illustrated embodiment, head 64 is slotted to accept a screwdriver blade, anchor 65 is threaded to engage a mounting nut 68 shown in FIG. 3a, and flange 67 is an enlarged annular disk coupled to throat 66 and shaped to resemble a washer.

Referring to FIGS. 1–3a, 7, and 15–26, it is apparent how easy it is for one person to position chassis 32 between two fully extended telescoping slide assemblies 14, lower chassis 32 so that mounting posts 30 "drop" into L-shaped post-receiving slots 34 formed in load-carrying slides 12 included in each of the telescoping slide assemblies 14, and move chassis 32 in a rearward direction 28 to cause post-locking latches 22 included in the retainers 10 mounted on each of load-carrying sides 12 to "lock" chassis 32 to load-carrying slides 12 without the need to use any tools. Release of mounting posts 30 from their "drop-and-lock" positions in post-receiving slots 34 to permit removal of chassis 32 from a mounted position on telescoping slide assemblies 14 is just as easy and is shown, for example, in FIG. 14a.

Throat 66 of mounting post 30 is sized to move easily in post-receiving slot 34, while head 64 and flange 67 each have a diameter that is greater than the width of post-receiving slot 34. Load-carrying slide 12 is formed to include a "wide" inlet opening 63 (see FIGS. 9–11) in horizontally extending flange 55 (which interconnects upper lip 58 and vertically extending-wall 57) that is sized to accept head 64 so that mounting post 30 can be moved to pass throat 66 into and through post-receiving slot 34 formed in wall 57 and head 64 into and through inlet opening 63 formed in flange 55.

One embodiment of retainer 10 is shown in FIGS. 1 and 9. Retainer 10 includes a first strip of material cantilevered to a forward end 70 of base 20 to provide post-locking latch 22 and a second strip of material cantilevered to a rearward end 71 of base 20 to provide slide lock 26. A connector 90 is arranged to pass through an aperture 91 formed in wall 57 of load-carrying slide 12 and an aperture 92 formed in a central portion of retainer base 20 to retain base 20 in a fixed position on wall 57. Such a mounting arrangement causes post-locking latch 22 to extend from base 20 in forward direction 24 toward post-receiving slot 34 formed in load-carrying slide 12 and causes slide lock 26 to extend from base 20 in rearward direction 28 to communicate with aperture 38 and retraction stop 36 formed in intermediate slide 18 as suggested in FIG. 11. Retainer base 20 is a flat plate in the illustrated embodiment. In one embodiment of retainer 10, a single piece of spring metal is formed to define post-locking latch 22, base 20, and slide lock 26.

Figure 14:
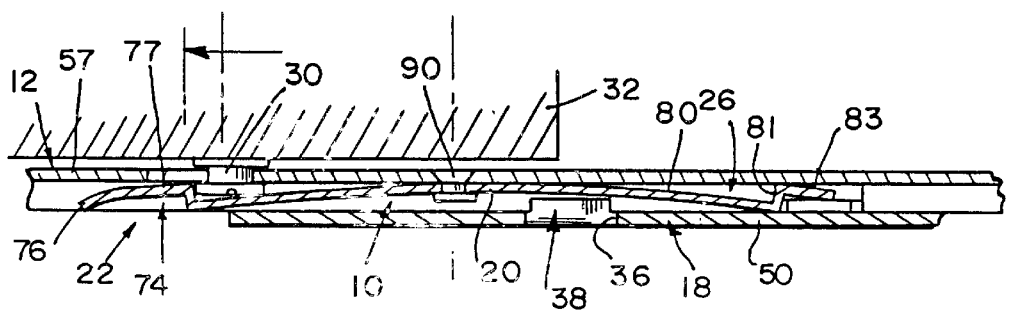
FIG. 14 is a sectional view similar to FIGS. 12 and 13 showing inward movement of the load-carrying slide relative to the intermediate slide following disengagement of the slide lock from the retraction stop on the intermediate slide.
Figure 14A:
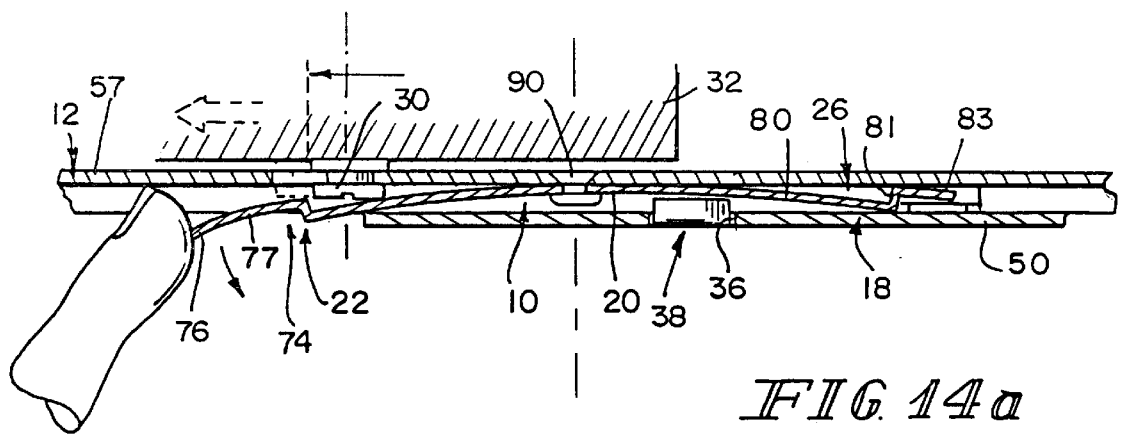
FIG. 14a is a sectional view similar to FIGS. 12–14 showing movement of a portion of the post-locking latch to a slot-opening position to allow removal of the mounting post from both the horizontal and vertical legs of the L-shaped post-receiving slot to permit removal of the chassis from a mounted position on the load-carrying slide of the telescoping slide assembly.

Post-locking latch 22 is arranged to move relative to load-carrying slide 12 from a slot-closing position shown, for example, in FIGS. 11, 14, and 24–26 to a slot-opening position shown, for example, in FIG. 14a to regulate entry and exit of a mounting post 30 in a post-receiving slot 34 formed in load-carrying slide 12. Post-locking latch 22 includes, in series, a lock support 72 cantilevered to base 20, a lock body 74 coupled to lock support 72, and a lock-release tab 76 coupled to lock body 74 as shown, for example, in FIG. 9.

Lock support 72 has one end cantilevered to forward end 70 of base 20 and another end coupled to a rearward end of lock body 74 normally to support lock body 74 in a post-blocking position relative to post-receiving slot 34 formed in load-carrying slide 12 to block exit of a mounting post in slot 34 from slot 34 when post-locking latch 22 occupies the slot-closing position as shown, for example, in FIGS. 11, 14, and 24–26. As shown in FIG. 9, lock-release tab 76 is coupled to a forward end of lock body 74 to define a distal or free end of post-locking latch 22. A user can grip lock-release tab 76 as shown in FIG. 14a to move post-locking latch 22 from the slot-closing position to the slot-opening position.

As shown, for example, in FIGS. 9, 17, 20, 23, and 26, lock body 74 in post-locking latch 22 includes a vertical lock-out-portion 77 and an inclined cam portion 78. Lock-out potion 77 extends vertically and is arranged to lie in spaced-apart relation to wall 57 of load-carrying slide 12 to block removal of a mounting post 30 located in the horizontally extending post-retainer portion 61 of post-receiving slot 34. Inclined cam portion 78 is appended to lock-out portion 77 and is oriented to lie at an obtuse angle 79 to the vertically extending lock-out portion 77 to intercept a mounting post passing downwardly through inlet opening 63 into the vertically extending entry portion 60 of post-receiving slot 34.

Lock support 72 bends away from wall 72 of load-carrying slide 12 as a mounting post 30 moves downwardly along inclined cam portion 78 to cause lock-out portion 77 to move horizontally (laterally) away from wall 57 of load-carrying slide 12 so that mounting post 30 can pass through vertically extending entry portion 60 of post-receiving slot 34, through heel portion 62, and into the horizontally extending post-retainer portion 61 of post-receiving slot 34. Once mounting post 30 is positioned to lie in post-retainer portion 61, lock body 74 (and its lock-out portion 77) moves horizontally (laterally) under a restoring force applied by lock support 72 in a direction toward wall 57 of load-carrying slide 12 to block removal of mounting post 30 extant in the horizontally extending post-retainer portion 61 of post-receiving slot 34. Normally, lock body 74 is supported in entry portion 60 of slot 34 by lock support 72. A user can grip lock-release tab 76 as shown in FIG. 14a to move lock body 74 horizontally in a direction away from wall 57 of load-carrying slide 12 to allow the mounting post to exit slot 34 through the vertically extending entry portion 60 and inlet opening 63.

Slide lock 26 is arranged to move relative to load-carrying slide 12 from a retraction-blocking position shown, for example, in FIGS. 2, 4, 11, 12, 15, 18, 21, and 24 to a release position shown, for example, in FIGS. 5, 6, 13, and 14 to regulate relative movement of load-carrying slide 12 and intermediate slide 18. Slide lock 26 includes a "movable retraction blocker" arranged to engage the retraction stop 36 on intermediate slide 18 and a "retraction blocker mover" configured normally to support the movable retraction blocker in a position engaging retraction stop 36 to block retraction of load-carrying slide 12 to a position within intermediate slide 18. Slide lock 26 includes, in series, an inclined segment 80 (providing the retraction blocker mover) cantilevered to base 20, a first vertical segment 81 (providing the movable retraction blocker) coupled to inclined segment 80 to define an acute included angle 82 therebetween, and a second vertical segment 83 coupled to the first vertical segment 81 to define a right angle therebetween as shown, for example, in FIG. 9.

Inclined segment 80 has one end cantilevered to rearward end 70 of base 20 and another end coupled to first vertical segment 81 normally to support first vertical segment 81 in a stop-engaging position arranged to intercept and engage the retraction stop 36 provided on intermediate slide 18 so as to block movement of load-carrying slide 12 relative to intermediate slide 18 in rearward direction 28 toward the retracted position within stationary slide 16 when slide lock 26 occupies the retraction-blocking position as shown, for example, in FIG. 11.

As shown best in FIG. 9, intermediate slide 18 is formed to include an interior edge defining aperture 38. A portion of that interior edge is arranged to provide retraction stop 36. Although the interior edge is rectangle-shaped in the illustrated embodiment, it is within the scope of this disclosure to provide such an interior edge with any suitable shape. Aperture 38 provides an opening through which a user can access and push against inclined segment 80 (or other suitable retraction blocker mover) to disengage first vertical segment 81 (or other suitable movable retraction blocker) from retraction stop 36. It is within the scope of this disclosure to locate retraction stop 36 on intermediate slide 18 apart from aperture 38.

As shown best in FIG. 9, intermediate slide 18 further includes a pair of spaced-apart extension stop tabs 84 and each tab 84 is arranged along another portion of the aperture-defining interior edge. Load-carrying slide 12 includes a pair of spaced-apart fixed extension blockers 85. Each fixed extension blocker 85 is located (e.g., on one of lips 58, 59) to engage a companion one of the extension stop tabs 84 to limit movement of load-carrying slide 12 relative to intermediate slide 18 to establish the fully extended position of load-carrying slide 12 as shown, for example, in FIGS. 11 and 12.

As shown best in FIGS. 1 and 11, each load-carrying slide 12 is formed to include a rearward slot 34 and a forward slot 34'. Retainer base 20 is coupled to load-carrying slide 12 to cause rearward slot 34 to lie between forward slot 34' and base 20 and to cause post-locking latch 22 to extend in forward direction 24 toward forward slot 34'.

Figure 8:
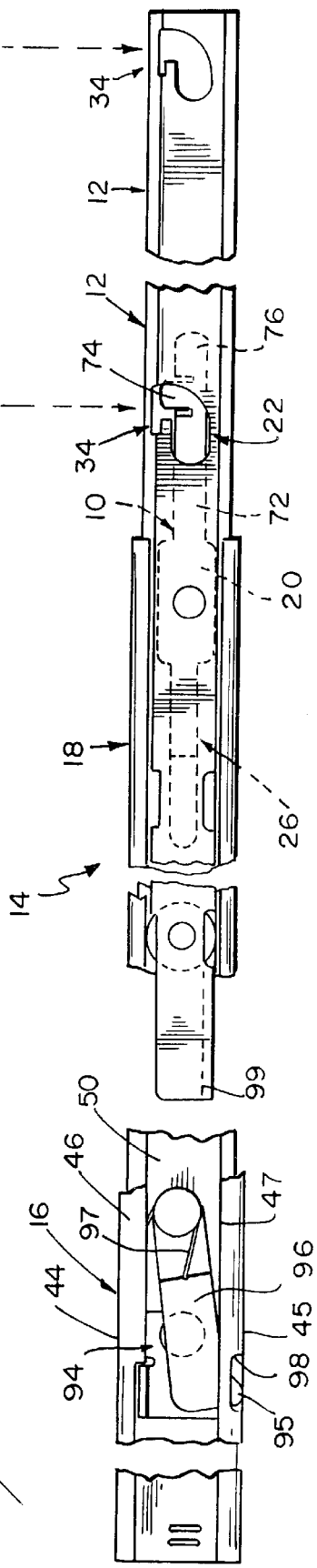
FIG. 8 is a side elevation view of FIG. 7 showing one of the telescoping slide assemblies in a fully extended position and showing the "phantom-line tracks" to be followed by the two mounting posts as they are inserted into the two post-receiving slots formed in the fully extended load-carrying slide.

An intermediate slide lock 94 is coupled to wall 50 of intermediate slide 18 as shown, for example, in FIG. 8. A catch portion 95 of body 96 is biased by spring 97 normally to be received within a cut-out portion 98 of stationary slide 16. A rearward end 99 of load-carrying slide 12 is arranged to intercept body 96 and move body 96 against spring 97 to withdraw catch portion 95 from cut-out portion 98 during rearward movement of load-carrying slide 12 so as to release intermediate slide 18 so that it can be moved in a rearward direction to a retracted position within stationary slide 16.

What is claimed is:

1. A telescoping slide assembly comprising
    interconnected load-carrying, intermediate, and stationary slides movable relative to one another to extend and retract the load-carrying and intermediate slides relative to the stationary slide between fully extended and retracted positions, the load-carrying slide being formed to include a slot adapted to receive a mounting post coupled to a piece of equipment to be carried on the load-carrying slide, the intermediate slide being formed to include a retraction stop, and
    a retainer coupled to the load-carrying slide to move therewith, the retainer including a post-locking latch arranged to move from a slot-closing position blocking exit of a mounting post in the slot from the slot to a slot-opening position allowing movement of a mounting post into and out of the slot, the retainer further including a slide lock arranged to move from a retraction-blocking position engaging the retraction stop on the intermediate slide to block movement of the load-carrying slide relative to the intermediate slide from the fully extended position toward the retracted position to a release position disengaging the retraction stop on the intermediate slide to allow movement of the load-carrying slide relative to the intermediate slide toward the retracted position.

2. The assembly of claim 1, wherein the retainer further includes a base coupled to the load-carrying slide, the post-locking latch is coupled to one portion of the base, and the slide lock is coupled to another portion of the base to cause the base to lie between the post-locking latch and the slide lock.

3. The assembly of claim 2, wherein the load-carrying slide is formed to include a pair of horizontally extending flanges and a vertically extending wall located between the pair of horizontally extending flanges and the base is coupled to the vertically extending wall to cause each of the post-locking latch and the slide lock to lie in a channel between the horizontally extending flanges.

4. The assembly of claim 3, wherein one end of the post-locking latch is cantilevered to the base and one end of the slide lock is cantilevered to the base.

5. The assembly of claim 2, wherein, a first strip of material is cantilevered to the base and formed to provide the post-locking latch and a second strip of material is cantilevered to the base and formed to provide the slide lock.

6. The assembly of claim 5, wherein a single piece of spring metal is formed to define the post-locking latch, the base, and the slide lock.

7. The assembly of claim 5, wherein the first strip of material includes a lock body and a lock support having one end cantilevered to the base and another end coupled to the lock body normally to support the lock body in a post-blocking position relative to the slot formed in the load-carrying slide to block exit of a mounting post in the slot from the slot when the post-locking latch occupies the slot-closing position.

8. The assembly of claim 5, wherein the first strip of material includes, in series, a lock support cantilevered to the base, a lock body coupled to the lock support and arranged to lie in a post-blocking position relative to the slot formed in the load-carrying slide to block exit of a mounting post in the slot from the slot when the post-locking latch occupies the slot-closing position, and a lock-release tab coupled to the lock body to define a distal end of the first strip of material.

9. The assembly of claim 5, wherein the second strip of material includes a movable retraction blocker and a retraction blocker mover having one end cantilevered to the base and another end coupled to the movable retraction blocker normally to support the movable retraction blocker in a stop-engaging position arranged to intercept and engage the retraction stop-on the intermediate slide to block movement of the load-carrying slide relative to the intermediate slide toward the retracted position when the slide lock occupies the retraction-blocking position.

10. The assembly of claim 5, wherein the second strip of material includes, in series, an inclined segment cantilevered to the base, a first vertical segment coupled to the inclined segment to define an acute included angle therebetween and arranged to intercept and engage the retraction stop on the intermediate slide to block movement of the load-carrying slide relative to the intermediate slide toward the retracted position when the slide lock occupies the retraction-blocking position, and a second vertical segment coupled to the first vertical segment to define a right angle therebetween.

11. The assembly of claim 2, wherein the base is a flat plate formed to include an aperture therein, the load-carrying slide includes a wall formed to include an aperture therein, and the retainer further includes a connector arranged to pass through said apertures to retain the flat plate in a fixed position on the wall of the load-carrying slide to cause the post-locking latch to extend from the base in a forward direction toward the slot formed in the load-carrying slide and to cause the slide, lock to extend from the base in a rearward direction opposite to the forward direction.

12. The assembly of claim 1, wherein the slot is L-shaped, the load-carrying slide is formed to provide the slot with a vertically extending entry portion and a horizontally extending post-retainer portion communicating with the vertically extending entry portion and extending in a rearward direction toward the intermediate slide, and the retainer further includes a base coupled to the load-carrying slide in a position causing the horizontally extending post-retainer portion to lie in a position between the vertically extending entry portion and the base.

13. The assembly of claim 12, wherein the post-locking latch includes a lock body-positioned to lie in the vertically extending entry portion of the slot and block removal of a mounting post located in the horizontally extending post-retainer portion of the slot from the slot through the vertically extending entry portion.

14. The assembly of claim 13, wherein the load-carrying slide is formed to include a pair of horizontally extending flanges and a vertically extending wall located between the pair of horizontally extending flanges, the vertically extending wall is formed to include the vertically extending entry portion and the horizontally extending post-retainer portion of the slot, one of the horizontally extending flanges is formed to include an inlet opening into the vertically extending entry portion, and the lock body include a vertically extending lock-out portion arranged to lie in spaced-apart relation to the vertically extending wall of the load-carrying slide to block removal of a mounting post located in the horizontally extending post-retainer portion and an inclined cam portion appended to the lock-out portion and oriented to lie at an obtuse angle to the vertically extending lock-out portion to intercept a mounting post passing through the inlet opening into the vertically extending entry portion.

15. The assembly of claim 13, wherein the post-locking latch further includes a bendable lock support coupled to the base and to the lock body to support the lock body normally in the vertically extending entry portion of the slot and the lock body is formed to include means for intercepting a mounting post moving into the vertically extending entry portion and bending the bendable lock support to cause the lock body to move horizontally away from the load-carrying slide so that the mounting post can pass through the vertically extending entry portion of the slot and into the horizontally extending post-retainer portion of the slot whereupon the lock body moves under a restoring force applied by the lock support to move horizontally toward the load-carrying slide to block removal of the mounting post a extant in the horizontally extending post-retainer portion of the slot.

16. The assembly of claim 13, wherein the post-locking latch further includes a lock support coupled to the base and to the lock body to support the lock body normally in the vertical entry portion of the slot and a lock-release tab coupled to the lock body to locate the lock body in a position between the lock-release tab and the lock support.

17. The assembly of claim 12, wherein the slide lock includes a movable retraction blocker and means for supporting the movable retraction blocker in a stop-engaging position arranged to intercept and engage the retraction stop on the intermediate slide to block movement of the load-carrying slide relative to the intermediate slide toward the retracted position when the slide lock occupies the retraction-blocking position.

18. The assembly of claim 17, wherein the supporting means is coupled to the base and positioned to lie between the base and the movable retraction blocker and between the slot and the movable retraction blocker.

19. The assembly of claim 1, wherein the slide lock includes a movable retraction blocker and means for supporting the movable retraction blocker in a stop-engaging position arranged to intercept and engage the retraction stop on the intermediate slide to block movement of the load-carrying slide relative to the intermediate slide toward the retracted position when the slide lock occupies the retraction-blocking position.

20. The assembly of claim 19, wherein the intermediate slide is formed to include an interior edge defining an aperture and a portion of the interior edge is arranged to provide the retraction stop.

21. The assembly of claim 20, wherein the intermediate slide further includes an extension stop tab arranged on the intermediate slide along another portion of the interior edge of the intermediate slide and the load-carrying slide includes a fixed extension blocker located to engage the extension stop tab on the intermediate slide to limit movement of the load-carrying slide relative to the intermediate slide to establish the fully extended position of the load-carrying slide.

22. A telescoping slide assembly comprising
interconnected load-carrying, intermediate, and stationary slides movable relative to one another to extend and retract the load-carrying and intermediate slides relative to the stationary slide, the load-carrying slide being formed to include forward and rearward slots, each slot being adapted to receive a mounting post coupled to a piece of equipment to be carried on the load-carrying slide, and
a retainer including a post-locking latch and a base coupled to the post-locking latch, the post-locking latch being arranged to move from a slot-closing position blocking exit of a mounting post in the rearward slot from the rearward slot and a slot-opening position allowing movement of a mounting post into and out of the rearward slot, the base being coupled to the load-carrying slide to cause the rearward slot to lie between the forward slot and the base-and to cause the post-locking latch to extend in a forward direction toward the forward slot.

23. The assembly of claim 22, further comprising a slide lock coupled to the base and arranged to extend away from the base in a rearward direction opposite to the forward direction and wherein the slide lock is arranged to move from a retraction-blocking position engaging a retraction stop provided on the intermediate slide to block movement of the load-carrying slide relative to the intermediate slide from the fully extended position toward the retracted position to a release position disengaging the retraction stop on the intermediate slide to allow movement of the load-carrying slide relative to the intermediate slide.

24. The assembly of claim 23, wherein the intermediate slide is formed to include an interior edge defining an aperture and a portion of the interior edge is arranged to provide the retraction stop.

25. The assembly of claim 23, wherein the slide lock includes a movable retraction blocker and means for supporting the movable retraction blocker in a stop-engaging position arranged to intercept and engage the retraction stop on the intermediate slide to block movement of the load-carrying slide relative to the intermediate slide toward the retracted position when the slide lock occupies the retraction-blocking position.

26. The assembly of claim 25, wherein the intermediate slide is formed to include an interior edge defining an aperture and a portion of the interior edge is arranged to provide the retraction stop.

27. The assembly of claim 22, wherein a first strip of material is cantilevered to the base and formed to provide the post-locking latch.

28. The assembly of claim 27, wherein the first strip of material includes a lock body and a lock support having one end cantilevered to the base and another end coupled to the lock body normally to support the lock body in a post-blocking position relative to the rearward slot formed in the load-carrying slide to block exit of a mounting post in the rearward slot from the rearward slot when the post-locking latch occupies the slot-closing position.

29. The assembly of claim 27, wherein the first strip of material includes, in series, a lock support cantilevered to the base, a lock body coupled to the lock support and arranged to lie in a post-blocking position relative to the rearward slot formed in the load-carrying slide to block exit of a mounting post in the rearward slot from the rearward slot when the post-locking latch occupies the slot-closing position, and a lock-release tab coupled to the lock body to define a distal end of the first strip of material.

30. A telescoping slide assembly comprising interconnected load-carrying, intermediate, and stationary slides movable relative to one another to extend and retract the load-carrying and intermediate slides relative to the stationary slide along a line of motion, the load-carrying slide being formed to include a slot adapted to receive a mounting post coupled to a piece of equipment to be carried on a load-carrying slide, and a retainer including a base coupled to the load-carrying slide, a lock body, and means for supporting the lock body for lateral movement relative to the line of motion between a slot-closing position near the load-carrying slide blocking exit of a mounting post in the slot from the slot and a slot-opening position away from the load-carrying slide allowing movement of a mounting post into and out of the slot.

\* \* \* \* \*